United States Patent
Gibson et al.

(10) Patent No.: US 7,185,973 B2
(45) Date of Patent: Mar. 6, 2007

(54) ASSEMBLY FOR MATERIAL DEPOSITION

(75) Inventors: Gary A. Gibson, Palo Alto, CA (US); Krzysztof Nauka, Redwood City, CA (US); Chung Ching Yang, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 211 days.

(21) Appl. No.: 10/954,263

(22) Filed: Oct. 1, 2004

(65) Prior Publication Data

US 2005/0093957 A1 May 5, 2005

Related U.S. Application Data

(63) Continuation-in-part of application No. 10/697,974, filed on Oct. 31, 2003, now Pat. No. 7,080,897.

(51) Int. Cl.
B41J 2/09 (2006.01)
B41J 2/02 (2006.01)

(52) U.S. Cl. .......................... 347/77; 347/73
(58) Field of Classification Search ................ 347/55, 347/73–82
See application file for complete search history.

(56) References Cited

U.S. PATENT DOCUMENTS

| | | | |
|---|---|---|---|
| 5,489,929 A * | 2/1996 | Vago | 347/55 |
| 6,401,001 B1 | 6/2002 | Jang et al. | |
| 6,413,790 B1 | 7/2002 | Duthaler et al. | |
| 6,520,402 B2 | 2/2003 | Orme-Marmerelis | |
| 6,521,489 B2 | 2/2003 | Duthaler et al. | |
| 2002/0118258 A1 * | 8/2002 | Bajeux | 347/77 |

OTHER PUBLICATIONS

Eshbach et al., "Recent Progress in Ink-Jet Technologies I", Electrostatic Source, 1996.
Hardman, Tony, "Inkjet Printer Operation", Printer Cartridges Ink, 1996.
Easen, Nick, "Want a PC This Xmas? Then Print It", CNN, Sep. 28, 2003.
Nelson, Amy, "Rayleigh Instability of an Annulus", ChE 385M: Surface Phenomena, May 4, 2000.
MicroFab Technote 99-01 Background on Ink-Jet Technology, Sep. 28, 1999.
Calvert, Paul, "Inkjet Printing for Materials and Devices", Dept of Materials Science & Engineering, Univ. of Arizona, 2001.
Darhuber, Anton et al., "Morphology of Liquid Microstructures on Chemically Patterned Surfaces", Journal of Applied Physics, vol. 87, No. 11, Jun. 2000.
Jaworek, Anatol et al., "Electrohydrodynamic Spraying", http://www.imp.gda.pl/ehd/ehd_spry.html.

(Continued)

Primary Examiner—K. Feggins (57) ABSTRACT

An assembly for depositing material onto a substrate includes a reservoir containing the material. The reservoir also includes a nozzle through which the material is jetted and formed into droplets. The droplets travel through flight paths prior to deposition onto the substrate. The assembly includes a charging ring for inducing an electrical charge to one or more of the droplets and a plurality of deflection plates for controlling the flight paths of the droplets. In addition, the assembly also includes a droplet manipulating device configured to manipulate the droplets at least one of during the flight paths and after deposition of the droplets onto the substrate.

40 Claims, 6 Drawing Sheets

OTHER PUBLICATIONS

Jaworek, Anatol et al., "Main Modes of Electrohydrodynamic Spraying of Liquids", ICMF Jun. 1998.

Lin2, S.P. et al., "Absolute and Convective Instability of a Liquid Jet", Clarkson University.

Canney, John et al., "Flexonics" Electrical Engineering and Computer Sciences, Univ. of California, Berkeley.

Tseng, Fan-Gang, "Micro-Droplet Generators", National Tsing Hua University, Taiwan.

Fel, Leonid G. et al., "Rayleigh Instability in Liquid Crystalline Jet" Dept of Civil Engineering, Technion, Isreal, Nov. 4, 2002.

Wehl, Prof. Dr. -Ing, Wolfgang, "Tintendruck: Strahlt er oder strahlt er nicht, das ist hier die Frage!", http://www.mm.fh-heilbronn.de/wehl/literat/tidruck.htm.

Yoshiko Hara; Inkjet Wiring Advances "Desktop Factory" Goal; www.eet.com; Nov. 8, 2004; 2 pages.

* cited by examiner

ASSEMBLY FOR MATERIAL DEPOSITION

RELATED CASE

The present application claims priority to and is a continuation-in-part of U.S. patent application Ser. No. 10/697,974, filed on Oct. 31, 2003 now U.S. Pat. No. 7,080,897. That application is incorporated by reference herein in its entirety.

BACKGROUND

Inkjet technology, which is well known for use in printing images onto paper, has also been employed in the fabrication of printed circuits. More particularly, inkjet printheads utilizing either thermal inkjet (TIJ) or piezoelectric (PZT) transducers have been employed to directly print circuit components onto circuit substrates.

There are two common manners in which fluid may be jetted from the printheads. One manner is known as drop-on-demand (DOD) and the other manner is known as continuous inkjet (CIJ). As the name suggests, DOD systems include systems designed to eject fluid through application of an electrical signal through a PZT element or a thin film resistor element when a drop is desired. CIJ systems, on the other hand, include systems designed to jet a stream of fluid that breaks up into droplets due to Rayleigh instability. In comparing these types of systems, DOD print heads have more complex fluidic design concerns but do not require a recirculation system for the ink. The DOD systems typically have much lower drop ejection frequency, drop velocity and larger drop size than CIJ systems because the fluid flow direction reverses during drop formation and break-off.

TIJ type printheads typically include a thin-film resistor for applying heat to superheat a small portion of the printing material above the heater element. During super-heating, a bubble of vaporized material is created and the explosive growth of the bubble expels the fluid in the nozzle of the printhead beyond the orifice to form droplets. The thin-film resistor is therefore positioned near and behind the nozzle and the printing material is fed to a location between the thin-film resistor and the nozzle opening. The use of TIJ type printheads is substantially limited by the types of materials that may be ejected from the printheads. For instance, TIJ type printheads may be unable to supply sufficient heat power to super-heat high melting temperature, thermally conductive materials.

PZT, or lead-zirconate-titanate, type printheads use PZT as a transducer whose dimensions change when it receives a voltage pulse. This dimensional change generates a pressure wave (acoustic wave) that propels the printing material through a nozzle of the printhead. PZT type printheads are not suitable for use in the typically high temperature environments necessary for application of many metals, inorganic semiconductors and ceramics because PZT elements commonly used as the actuators are limited by the depolarization temperature for their piezoelectricity.

Another drawback associated with DOD type printheads in printing circuit components is that its drop frequency is limited by the ac impedance associated with its fluidic circuit that employs ac type of fluid motion.

Therefore, it would be desirable to have a relatively simple and inexpensive printing device capable of printing a large number of various materials onto various types of substrates.

SUMMARY

An assembly for depositing material onto a substrate is disclosed. The assembly includes a reservoir containing the material and the reservoir includes a nozzle through which the material is jetted and formed into droplets. The droplets travel through flight paths prior to deposition onto the substrate. The assembly includes a charging ring for inducing an electrical charge to one or more of the droplets and a plurality of deflection plates for controlling the flight paths of the droplets. In addition, the assembly also includes a droplet manipulating device configured to manipulate the droplets at least one of during the flight paths and after deposition of the droplets onto the substrate.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to examples thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

A printing system is configured to accurately and efficiently deliver materials onto a substrate, for instance, for use in the fabrication of electronic circuits. The printing system generally implements a continuous inkjet (CIJ) printing technique, in that, the material is jetted from a reservoir under a substantially static pressure. Under the static pressure, the material may be ejected from the nozzle of the reservoir generally as a fluid column, which breaks-up into droplets as naturally governed by the Rayleigh instability principle. A transducer or other electromechanical device may be incorporated to the reservoir and may operate to regulate the frequency of droplet formation. Once formed, the droplets may travel through a charging ring and some or all of the droplets may be electrically charged through induction or capacitance.

A pair of deflection plates or a larger number of deflection plates may also be employed to divert some or all of the charged droplets into a collection plate designed to, for instance, receive unwanted droplets. The discarded droplets received by the collection plate may be recycled back to the reservoir or they may be sent to a waste area. In addition, the uncharged droplets may travel to and become deposited on the substrate. Changing the relative positions of the jet nozzle and the substrate may vary the locations of droplet attachment. For instance, the jet reservoir or the substrate may be mounted on a support plate configured to move in one or more dimensions. In this manner, the droplets may be attached to the substrate at various locations thereof.

In one example, substantially all of the droplets traveling through the charging ring may receive a charge. The deflection plates may be operated to control the flight paths of the droplets. In general, the deflection plates may cause some or all of the droplets to be diverted to the collection plate or the substrate. In addition, the deflection plates may also vary the flight paths of the droplets configured for attachment to the substrate to thereby control the locations of droplet attachments onto the substrate.

In another example, satellite droplets may be generated during droplet formation. Satellite droplets may be substantially smaller than the other droplets and their formation may be controlled through control of the fluid column. In addition, the satellite droplets may be electrically charged in manners similar to those described herein above with respect to the droplets. The flight paths of charged satellite droplets may be deflected through use of the deflection plates such that they are deposited onto the substrate to form relatively smaller patterns on the substrate. Moreover, the satellite droplets may be manipulated in additional manners as described in greater detail herein below.

The droplets may also travel through a droplet manipulating device, such as, for instance, a chamber designed to house a gas for varying a characteristic of the droplet (for instance, through reaction with the drop), devices configured to vary the temperature of the ambient through which the droplets travel, devices configured to vary the orientation of the molecules contained in the droplets, a laser to manipulate the droplets either during flight or after hitting the substrate, etc. The droplet manipulating device may be configured to manipulate the droplets at various times during formation and placement on the substrate.

Through implementation of the printing system disclosed herein, greater flexibility in the types of materials that may be deposited onto various types of substrates may be achieved. In addition, the materials may be deposited under various deposition schemes to generally enable relatively broad applications in at least one of creating new devices and reconfiguring existing devices, the devices comprising, for instance, electronic circuits.

Figure 1A:
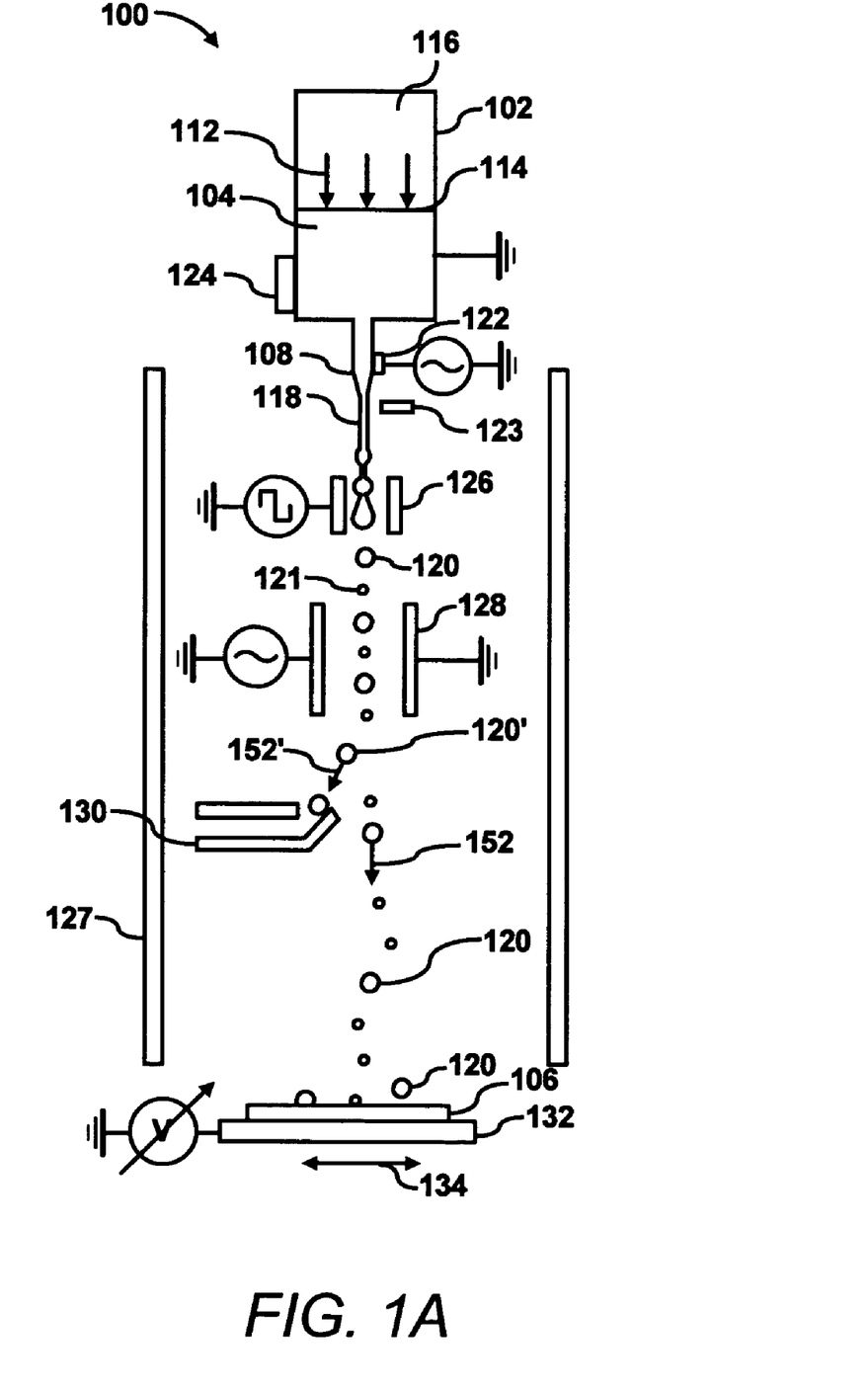
FIGS. 1A–1D show schematic illustrations of various jetting assemblies for delivering material onto substrates, according to various embodiments of the invention.

FIG. 1A shows a schematic illustration, partially in cross-section, of a jetting assembly 100 for delivering material 104 onto a substrate 106. The system includes a jetting assembly 100 having a reservoir 102 for containing the material 104 to be delivered to the substrate 106. The reservoir 102 may include a substance that is chemically non-reactive with the material 104. The reservoir 102 may also include, for instance, an interior lining that is chemically non-reactive with the material 104. In this regard, the reservoir 102 may be considered as a passive device because the reservoir 102 may dispense the material 104 without imparting significant heat energy onto the material 104. However, the reservoir 102, or more particularly, devices contained in the reservoir 102 may impart kinetic energy to maintain substantially constant static pressure in the reservoir 102.

If, however, the reservoir 102 is configured to transfer energy into the material 104, the reservoir 102 may be considered as an active device. By way of example, the reservoir 102 may be configured with a mechanism 124 to heat the material 104. The heat may be imparted onto the material 104, for instance, resistively, optically, inductively, or through another form of radiation, for instance, particle bombardment, microwave, etc. The use of reservoirs 102 configured as passive or active devices may be predicated upon the material 104 contained in the reservoirs 102. For instance, reservoirs 102 configured as active devices may be employed if the material 104 is required to be heated, such as, metals, semiconductors, dielectrics and various composite and other types of materials, etc.

The material 104 may comprise any reasonably suitable material configured for use, for instance, in the fabrication of electronic circuits. Suitable materials include, for instance, inorganic and organic conductive materials, inorganic and organic semiconductor materials, inorganic and organic dielectric materials, inorganic and organic ferroelectric materials, inorganic and organic optical and photonic materials, resist materials, dopant materials, additives, catalysts, reactive materials, metals, passivation materials, etchants, dopants, protective coatings, etc. The materials may also include molten or liquid materials, material particles suspended in a liquid medium, colloidal suspensions of the material particles in a medium, liquid chemical compounds containing the material, chemical solutions of the material with a liquid solvent, chemical materials capable of enhancing or modifying one or more properties of other deposited materials, chemical materials capable of enhancing or modifying one or more properties of the substrate on which the materials are deposited, etc. In addition, the material 104 may comprise a composite, alloy, or combinations of materials.

The reservoir 102 is illustrated as including a nozzle 108 through which the material 104 is ejected. Pressure, as indicated by the arrows 112, may be applied onto a relatively large portion of the surface 114 of the material 104 contained in the reservoir 102 to cause the material 104 to be ejected through the nozzle 108. The pressure may be applied by any reasonably suitable pressurizing means for applying substantially uniform pressure onto the fluid body contained in the reservoir 102. The pressurizing means may include a gas, for instance, air, nitrogen, argon, or other suitable gas, supplied into an open space 116 between the material surface 114 and the reservoir 102. The pressure may also be applied to the material 104 through introduction of additional material 104 into the reservoir 102. Although not shown, the pressurizing means may also include mechanical devices, such as, a movable plunger, a diaphragm, a piston, a plate, etc., positioned to apply pressure onto the material surface 114.

In any regard, the material 104 is illustrated as being jetted as a fluid column 118 from the nozzle 108. The length of the fluid column 118, as well as, the velocity at which the fluid column 118 is ejected from the nozzle 108 may substantially be controlled by varying the pressure applied to the material 104. As the fluid column 118 reaches a critical length, depending upon, for instance, the pressure applied to the material 104 and the composition of the material 104, the fluid column 118 becomes unstable and begins to form droplets 120. This instability in the fluid column 118 as it reaches a critical value that leads to droplet 120 formation is dictated by the Rayleigh instability principle. In part, Rayleigh discovered that fluid under pressure issuing from an orifice breaks up into uniform drops by the modulation of a capillary wave that is induced into the liquid stream. As shown, a lead-zirconate-titanate (PZT) transducer 122 is positioned proximate the nozzle 108 and generally operates to induce pressure modulations into the fluid column 118. The PZT transducer 122 may be positioned outside of the nozzle 108 or reservoir 104 in any reasonably suitable manner to substantially prevent heat from the material 104 from adversely affecting operations of the PZT transducer 122. A thermally insulating material (not shown) may be provided as an interface between the PZT transducer 122 and the printhead body to generally protect the PZT transducer 122 from heat that may be transmitted from the material 104.

Satellite droplets 121 may also be formed from the fluid column 118 in addition to the droplets 120. The satellite droplets 121 may be formed during capillary breakup of the fluid column 118. The satellite droplets are relatively smaller than the droplets 120 and may be used to form relatively smaller structures on the substrate 106. In one regard, the droplets 120 may be discarded as described below and only the satellite droplets 121 may be deposited onto the substrate 106 to thus form the relatively smaller structures.

Although FIG. 1A illustrates a PZT transducer 122 to produce pressure modulations, any reasonably suitable electromechanical device capable of producing suitable pressure modulations may be employed without departing from a scope of the jetting assembly 100.

Also shown in FIG. 1A is a capping device 123 configured to cap the nozzle 108 when, for instance, the jetting assembly 100 is not in use. The capping device 123 may be movable between a substantially closed position of the nozzle 108 and a substantially open position with respect to the nozzle 108 as shown in FIG. 1A. In this regard, the capping device 123 may be operable to close the nozzle 108 to substantially prevent loss of the material 104, drying of the material 104 contained in the nozzle 108, contamination of the material 104, reaction of the material 104 with the ambient, etc.

The droplets 120 of material 104 are caused to hit the substrate 106 and the locations upon which the droplets 120 hit the substrate 106 may be computer controlled. In one example, the jetting assembly 100 may be moved to various positions with respect to the substrate 106 to thereby vary the positioning of the droplets on the substrate 106. More particularly, the jetting assembly 100 may, for instance, be scanned across the substrate 106 in a number of passes to generally enable the droplets 120 to be placed on the substrate 106 at the various locations. In another example, the substrate 106 may be supported on a movable support plate 132 configured to vary the position of the substrate 106 with respect to the jetting assembly 100.

The substrate 106 may include any number of characteristics and materials. For instance, the substrate 106 may be inert with respect to the droplets 120. More particularly, the substrate 106 may be formed of one or more materials that are configured to be chemically inert with the droplets 120. In addition, the substrate 106 may be configured to remain passive in terms of heat conduction with respect to the droplets. Alternatively, the substrate 106 may be configured to be heated or otherwise conduct heat to thereby impart heat into the droplets 120 that land on the substrate 106. As another example, the substrate 106 may be formed of one or more materials or may otherwise be configured to enable some type of reaction with the droplets 120. For instance, the substrate 106 may comprise one or materials designed to chemically react with at least one of the droplets 120 and the ambient air. By way of example, the substrate 106 may include one or more materials that generally operate as a template for crystal growth. As another example, the substrate 106 may operate as a catalyst for a chemical reaction between, for instance, a supplied gas and the droplets 120. The selection of the composition of the material 104 and the substrate 106 may be based upon various desired physical properties of at least one of the material 104 and the substrate 106. In addition, the selection of other elements to facilitate chemical processes on one or both of the material 104 and the substrate 106 may also be based upon the desired physical properties of one or both the material 104 and the substrate 106.

The substrate 106 may also comprise a new substrate, that is, a substrate that has not been previously fabricated with various components. Alternatively, the substrate 106 may comprise an existing device, for instance, a prefabricated circuit, a flexible interconnect cable, a microelectro-mechanical structure device, etc. In this regard, the jetting assembly 100 may be employed to fabricate components on new and existing circuits or to modify components on existing circuits.

The jetting assembly 100 may also include a heating element 124 positioned to supply heat to the material 104 contained in the reservoir 102. Inclusion of the heating element 124 generally enables the reservoir 102 to be configured as an active device. In addition, the heating element 124 may include any reasonably suitable heating element configured to supply sufficient heat power to the material 104 to maintain the material 104 in a form capable of being jetted through the nozzle 108. In this regard, the heating element 124 may be selected and operated, for instance, according to the composition of the material 104 contained in the reservoir 102. The position of the heating element 124 in FIG. 1A is for illustrative purposes only and is not meant to limit the jetting assembly 100 in any respect. In addition, therefore, the heating element 124 may be positioned at any reasonably suitable location with respect to the reservoir 102, including being positioned within the reservoir 102, without departing from a scope of the jetting assembly 100.

The jetting assembly 100 also includes components designed to vary the flight paths of one or more of the droplets 120. One of these components is a charging ring 126, which generally includes a conductive device configured to induce a charge to the droplets 120 inductively. For charge induction, the voltage polarity that is applied to the charging ring 126 with the fluid column 118 electrically grounded through the reservoir 102, determines the charge polarity of the charged droplets. In this regard, the charging ring 126 is configured to receive an electrostatic potential and to induce charges to the front end of the fluid column 118. The charges are trapped in the droplets 120 as the droplets 120 break off from the fluid column 118. Droplets 120 remain neutral if the electrostatic potential at the charging ring 126 is absent during break off from the fluid column 118.

Other components include deflection plates 128, which are electrically conductive devices configured to receive and deploy electrostatic potential. An electrostatic potential difference may be applied to the deflection plates 128 to alter the direction of droplet 120 travel. For instance, a substantially constant potential difference may be applied to the deflection plates 128 such that all of the droplets 120, for example, unwanted droplets 120' that receive charges from the charging ring 126 are diverted to a collection plate 130, as indicated by arrow 152'. In this example, the neutral droplets 120 travel straight through the deflection plates 128 and are deposited on the substrate 106, as indicated by arrow 152. As an alternative, some or all of the droplets 120 may receive charges from the charging ring 126 and the deflection plates 128 may be operated in a manner to divert certain ones or all of the droplets 120, for instance, the unwanted droplets 120', to the collection plate 130.

The deflection plates 128 may also be operated in a manner to alter the trajectories of certain ones of the charged droplets 120. More particularly, the deflection plates 128 may be operated to divert droplets 120 having certain charge/mass ratios that fall outside of a predetermined charge/mass ratio range. For instance, the droplets 120 may obtain a charge dependent on their masses and those droplets 120 having a certain ratio of charge to mass, for example, smaller droplets 120 or satellite droplets 121, may be considered unwanted droplets 120' and may be diverted to the collection plate 130. Alternatively, those droplets 120 having the certain charge, for instance, smaller droplets 120 or satellite droplets 121, may pass through the deflector plates 128 and become deposited on the substrate 106. In one regard, the deflection plates 128 may be operated to deploy an electrostatic potential having sufficient strength to cause the trajectories of the droplets 120 or satellite droplets 121 having the certain charges to be diverted.

The collection plate 130 may comprise a means for gathering unwanted droplets 120' and a means for recycling the unused or unwanted droplets 120'. In this regard, the collection plate 130 may include a heating element (not shown) configured to maintain the unwanted droplets 120' in liquid form, if necessary. In addition, the collection plate 130 may include a means for conveying the unused material 104 back to the reservoir 102 for re-use. The means for conveying may include a pump or other device known for use in manipulating fluids.

The droplets 120 or satellite droplets 121 that are not diverted to the collection plate 130 are substantially free to travel to and impact the substrate 106. The substrate 106 may be mounted on a movable support plate 132, which may be movable as shown by arrow 134. The arrow 134 is illustrated to indicate that the support plate 132 may be moved in a horizontal motion parallel to the plane of FIG. 1A. In certain instances, the support plate 132 may also be moved in a direction into and out of the plane of FIG. 1A, as may be used, for instance, when the deposited droplets 120, 121 form two-dimensional patterns as required by the circuitry.

Through relative movement between the support plate 132 and the trajectories of the droplets 120, 121, placement of the droplets 120, 121 onto the substrate 106 may be controlled in an effective manner. In the example above, the locations of the droplet 120, 121 placements may be controlled in two dimensions. In another example, the support plate 132 may be configured to move in only one dimension, for instance, in the directions shown by the arrow 134. In any regard, the droplets 120, 121 may be deposited on the substrate 106 with at least two degrees of freedom. The droplets 120, 121 may also be stacked upon each other to generally enable structures created by the droplets 120, 121 to have heights higher than single droplets 120, 121 or to otherwise form a layered structure.

The jetting assembly 100 may further include one or more components designed to act upon or otherwise manipulate the droplets 120, 121 during at least one of flight and after the droplets 120, 121 have impacted the substrate 106. In this regard, a droplet manipulating device 127 configured to act upon the droplets 120, 121 in some manner as described herein below may be provided to act upon the droplets 120, 121. The droplet manipulating device 127 may, in certain instances, comprise a ring or a chamber that encompasses an area around where the droplets 120 are jetted from the nozzle 108 to the substrate 106. In other instances, the droplet manipulating device 127 may be positioned to manipulate the droplets 120, 121 during particular times during flight or after the droplets 120, 121 have impacted the substrate 106. Thus, the depiction of the droplet manipulating device 127 as being positioned between the deflection plates 128 and the substrate 106 is not intended to limit the jetting assembly 100 in any respect.

In one example, the droplet manipulating device 127 may comprise a chamber configured to control or vary the ambient conditions through which the droplets 120, 121 travel. For instance, the droplet manipulating device 127 may include a heater or air conditioner (not shown) to maintain the temperature of the ambient at desired levels or a device for controlling the humidity of the ambient. The heater may comprise, for instance, a resistive heater, a radiating heater, an inductive heater, etc. The chamber may also comprise a thermally insulating barrier that operates to substantially maintain the desired temperature in the droplet manipulating device 127.

In addition, or alternatively, the droplet manipulating device 127 may include a delivery system for the introduction and control of various gases that may be contained in the space through which the droplets 120, 121 travel. The chamber of the droplet manipulating device 127 may thus comprise a generally enclosed space that may operate to contain the gases. The gases may be selected, for instance, to chemically react with the droplets 120, 121 to obtain one or more desired properties. The selection of the gases may be based upon the desired reactions on the droplets 120, 121, or the desired properties of the droplets 120, 121.

The droplet manipulating device 127 may also include a system (not shown) for affecting the formation of the droplets 120, 121 through means other than heat conduction. For instance, the droplet manipulating device 127 may include means for aerodynamic control through pressure or ambient motion (for instance, wind or other airflow). Alternatively, depending upon the composition of the droplets 120, 121, the droplet manipulating device 127 may include means for aerodynamic control based upon the dielectric properties of the material 104. This example is discussed in greater detail herein below with respect to, for instance, FIG. 1B.

The droplet manipulating device 127 may further include a system (not shown) configured to affect the steering and stability of the droplets 120, 121 as they travel between the nozzle 108 and the substrate 106. For instance, the droplet manipulating device 127 may include means for aerodynamic control through pressure or ambient motion (for instance, wind or other airflow). Alternatively, depending upon the materials 104 contained in the droplets 120, the droplet manipulating device 127 may include means for affecting the steering and stability of the droplets 120 based upon the dielectric properties of the material 104. Through use of some of the various means described herein above, for instance, the positions at which the droplets 120 hit the substrate 106 may be varied without requiring positional changes between the nozzle 108 and the substrate 106.

The droplet manipulation device 127 may further include one or more lasers (not shown) configured to perform various manipulations on the droplets 120, 121. The one or more lasers may be configured to manipulate the droplets 120, 121 during flight or after the droplets 120, 121 have impacted the substrate 106. If the one or more lasers are configured to manipulate the droplets 120, 121 during flight, the one or more lasers may be configured to selectively alter the sizes of the droplets 120, 121. In this instance, for example, the one or more lasers may be employed to effectively burn off some portion of the droplets 120, 121 to thereby reduce their sizes. As another example, the one or more lasers may be configured to impart energy into the droplets 120, 121 to thereby initiate a chemical reaction in the droplets 120, 121. If the one or more lasers are configured to manipulate the droplets 120, 121 after they have impacted the substrate, the one or more lasers may be configured to, for instance, anneal the deposited material 104, sinter the deposited material 104, impart energy into the deposited material 104 to initiate a reaction to, for instance, improve electrical properties of the deposited materials, etc.

The droplet manipulation device 127 may further include magnetic coils (not shown) designed to impart a magnetic field on the droplets 120, 121. In one respect, the magnetic coils may be employed to orientate molecules contained in the droplets 120, 121, to for instance, improve electrical properties of the droplets 120, 121.

As described herein above, the substrate 106 may be mounted on a support plate 132. Although the support plate 132 may function as described herein above, the support plate 132 may also be configured to receive an electrostatic potential. The electrostatic potential received by the support plate 132 may be applied to, for instance, either retard or accelerate the drop velocities of the droplets 120, 121. For instance, if the droplets 120, 121 are negatively charged, their drop velocities may be retarded by applying a negative electrostatic potential to the support plate 132. Conversely, the velocities of the droplets 120, 121 may be accelerated by applying a positive electrostatic potential to the support plate 132. Therefore, the variance in the velocities of the droplets 120, 121 is another control parameter that may be useful in manipulating deposition of the droplets 120, 121 onto the substrate 106.

In addition, magnetic coils (not shown) may be included as part of the support plate 132 or as a separate system for imparting a magnetic field around the substrate 106. The magnetic coils may be employed to orientate the molecules contained in the droplets 120, 121 either during flight or after the droplets 120, 121 have impacted the substrate 106. The orientation of the molecules may be aligned, for instance, to improve certain electrical or magnetic properties of the material 104 deposited onto the substrate.

Although not shown in FIG. 1A, the reservoir 102 may include the re-filling device 154 shown in FIG. 1C and described herein below with respect to FIG. 1C. Additional material 104, having either the same or different composition, may therefore be inserted into the reservoir 102 through the re-filling device 154.

The reservoir 102 may also comprise a replaceable component of the jetting assembly 100. That is, for instance, the reservoir 102 may be removably attached to the he PZT transducer 122 such that the reservoir 102 may be replaced when the material 104 contained therein is consumed or when a different reservoir 102 containing a different material is to be employed in the jetting assembly 100. As another example, the reservoir 102 and the PZT transducer 122 may comprise an integrally manufactured component that may be replaced in, for instance, the situations described above.

The material 104 may include substances that may be activated or otherwise undergo a chemical reaction. The material 104 may undergo the chemical reaction at any number of various times depending upon the composition of the material 104 as well as when the chemical reaction is desired to take place. For instance, the material 104 may undergo the chemical reaction through contact with another material that may be contained in the reservoir 102 or that may be introduced into the reservoir 102 along with or following introduction of the material 104. As another example, the material 104 may undergo the chemical reaction through receipt of energy in the form of, for instance, light, heat, radiation, microwaves, etc., through irradiation with particles, such as, with an electron beam or other electrically charged or neutral particles, through reaction with other chemicals, etc. In this instance, the material 104 may be configured to undergo the chemical reaction within the reservoir 102, after the material 104 is jetted from the reservoir 102 but before the material 104 hits the substrate 106, after the material 104 has hit the substrate 106, or combinations thereof. The selection of when to cause the chemical reaction to occur may be based upon the desired physical properties of the material 104 on the substrate 106.

In addition, the material 104 and the substrate 106 may be selected to generally cause the material 104 to chemically react with the substrate 106. The chemical reaction between the material 104 and the substrate 106 may be performed through, for instance, contact between the material 104 and the substrate 106, through application of energy, such as, heat, radiation, microwaves, light, etc., through irradiation with particles, such as, with an electron beam or other electrically charged particles, through reaction with other chemicals, etc. In any regard, the substrate 106 itself may undergo a transformation through chemical reaction with at least one of the material 104, the applied energy, and the other chemicals.

The jetting assembly 100 may be operated to deposit a first material 104 contained in the reservoir 102 onto the substrate 106. The jetting assembly 100 may also be operated to deposit a second and other subsequent materials 104 contained in the reservoir 102 onto the substrate 106. In one example, the reservoir 102 may be replenished with different materials 104 as they are deposited onto the substrate 106. In another example, the reservoir 102 containing a first material 104 may be replaced with another reservoir 102 containing a second material 104 and so forth. In this regard, various types of material 104 may be deposited onto the substrate 106 either in different locations on the substrate 106 or to form layers of materials 104 on the substrate 106. In addition, the material 104 deposited onto the substrate 106 may undergo various chemical reactions as described above.

A plurality of jetting assemblies 100 may be positioned, for instance, in a direction along an axis that extends into the plane of FIG. 1A or parallel to the plane of FIG. 1A. In addition, the plurality of reservoirs 102 may each contain the same or different materials 104. Through use of a plurality of reservoirs 102, the droplets 120 from the plurality of reservoirs 102 may be applied to various locations on the substrate 106 to form an electronic circuit through, for instance, relative movement between the plurality of reservoirs 102 and the support plate 132 along one or more dimensions. In addition, the electronic circuit may be formed through application of various materials in a substantially simultaneous manner, which may reduce the electronic circuit fabrication time.

Moreover, various types of materials 104 may be substantially concurrently applied onto the substrate 106 through use of the plurality of jetting assemblies 100. In one example, the different materials 104 may be applied substantially concurrently at different locations on the substrate 106. Alternatively, the different materials 104 may be applied at substantially similar locations on the substrate 106. In this regard, for instance, materials configured to react with one another may be stored in the different reservoirs 102 and may be applied to substantially similar locations such that they react with each other when they are applied on the substrate 106. As another example, the materials 104 from the different reservoirs 102 may be applied to similar locations in succession such that they react with each other as the later deposited materials 104 are applied. As a yet further example, the materials 104 from the different reservoirs 102 may be jetted and their flight paths may be controlled in manners to substantially enable the droplets 120 to react with each other prior to hitting the substrate 106.

In the examples described herein above, the materials 104 and in certain instances, the substrate 106, may be caused to undergo a chemical reaction to, for instance, obtain desired physical properties. The chemical reactions that may occur may be based upon the materials 104 themselves and in certain instances, the composition of the substrate 106. In addition, or alternatively, the chemical reactions may be initiated or otherwise performed through application of energy, irradiation of particles, introduction of gases, etc., as described in greater detail herein above.

Application of the one or more materials 104 as described herein above may be used for various purposes. For instance, the one or more materials 104 may be applied onto the substrate 106 to form a trace or a pattern that forms part of an electronic device, such as, a conducting path, a dielectric film, a semiconductor, an electron emitter, a passivation layer, etc. As another example, the one or more materials 104 may form a trace configured to modify local properties of the substrate 106. Examples of this type of application include, for instance, use as a lithography mask, use as a source of dopant, etc. Another example includes the use of one or more materials 104 to locally apply an etchant, such as, material that reacts with the substrate 106 or a previously deposited layer of material 104, in which part of the substrate 106 or the previously deposited material 104 layer turns into a gaseous or liquid product that may be removed. As a further example, the one or more materials 104 may be used to form an underlayer upon which a final trace or pattern may subsequently be deposited. In this example, the underlayer may form a necessary component to achieve the desired properties of the final trace or pattern.

Another example of the various purposes achievable through application of the one or more materials 104 includes the ability to form a trace or pattern on an existing circuit that may have been fabricated using at least one of a similar or different method, such as, photolithography. One benefit to this example may include the ability to impart additional functionality to the circuit. Another benefit may be to simplify the fabrication of the circuit, for instance, by combining other known circuit fabrication techniques with those described herein above. As an example, the application of the one or more materials 104 as described herein above may be used on prefabricated circuit substrates, such as, printed circuit boards, flexible interconnect cables, microelectromechanical devices, etc., to, for instance, at least one of complete the electrical functionality and to add functionality to the prefabricated devices.

In a further example, the one or more materials 104 may be applied as described herein above to provide environmental protection to various areas of new or existing devices (for instance, circuits), to provide additional electrical connects to the new or existing devices, to assist in at least one of the control and confinement of the shape and size of the dispensed materials, etc. In addition, the one or more materials 104 may be applied as described herein above to alter existing circuits by. rerouting, removing, disabling, etc., at least one of interconnects and devices, as well as to add other interconnects or devices onto the existing circuits.

Figure 1B:
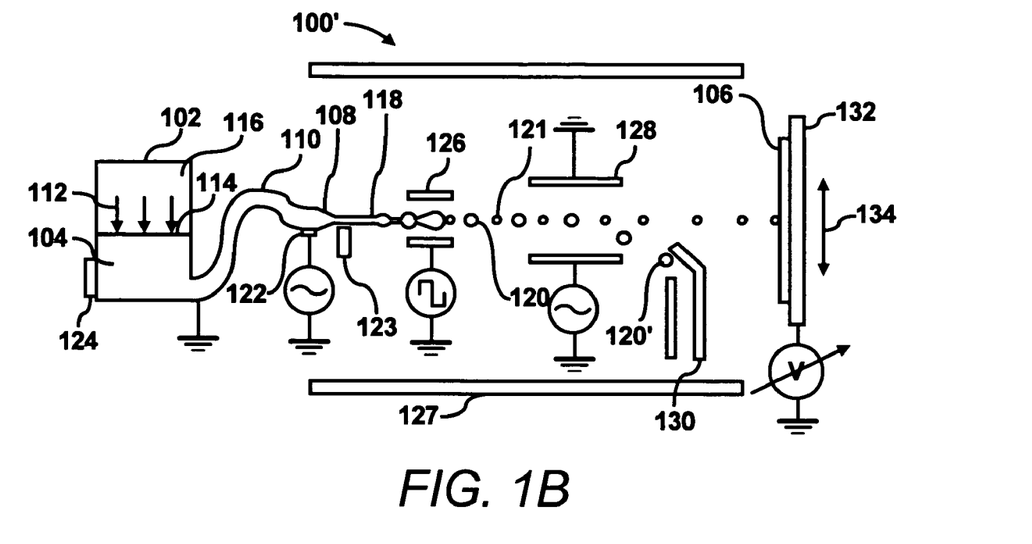

With reference now to FIG. 1B, there is shown a simplified schematic illustration of a jetting assembly 100' for delivering material 104 onto a substrate 106, in which an arcuate, for instance, curved, arched, etc., section 110 is positioned in the path of the material flow between the reservoir 102 and the nozzle 108. As will be described in greater detail herein below, the arcuate section 110 may be useful in substantially preventing blockage of the nozzle 108.

As shown, the jetting assembly 100' depicted in FIG. 1B contains many of the elements described with respect to FIG. 1A. Therefore, the following discussion of FIG. 1B is set forth with the understanding that those elements not specifically described are to be understood as having been described herein above with respect to FIG. 1A. In this regard, only those elements that differ from the elements described with respect to FIG. 1A will be described in detail.

In FIG. 1B, the jetting assembly 100' is generally illustrated to shown that the satellite droplets 121 are deposited onto the substrate 106, whereas the droplets 120 are diverted to the collection plate 130. In this regard, smaller structures may be formed on the substrate 106 through deposition of the satellite droplets 121.

As previously stated herein above, the arcuate section 110 may be useful in preventing blockage of the nozzle 108. The configuration of the reservoir 102 illustrated in FIG. 1B requires that the material 104 flow through the arcuate section 110 prior to being jetted through the nozzle 108. In addition, the nozzle 108 has a relatively higher position as compared to the height of the material surface 114. Thus, when the pressure applying means 112 ceases to apply pressure to the material 104, the material 104 contained in the nozzle 108 is caused to flow back into a main cavity of the reservoir 102 until its surface reaches the same height as the material surface 114 inside the reservoir 102, at a location between the arcuate section 110 and the reservoir body 104. In this regard, the arcuate section 110 substantially prevents the material 104 from settling in a location near the nozzle 108. In one regard, therefore, the material 104 is substantially prevented from drying up and clogging the nozzle 108 during inactivity.

Figure 1C:
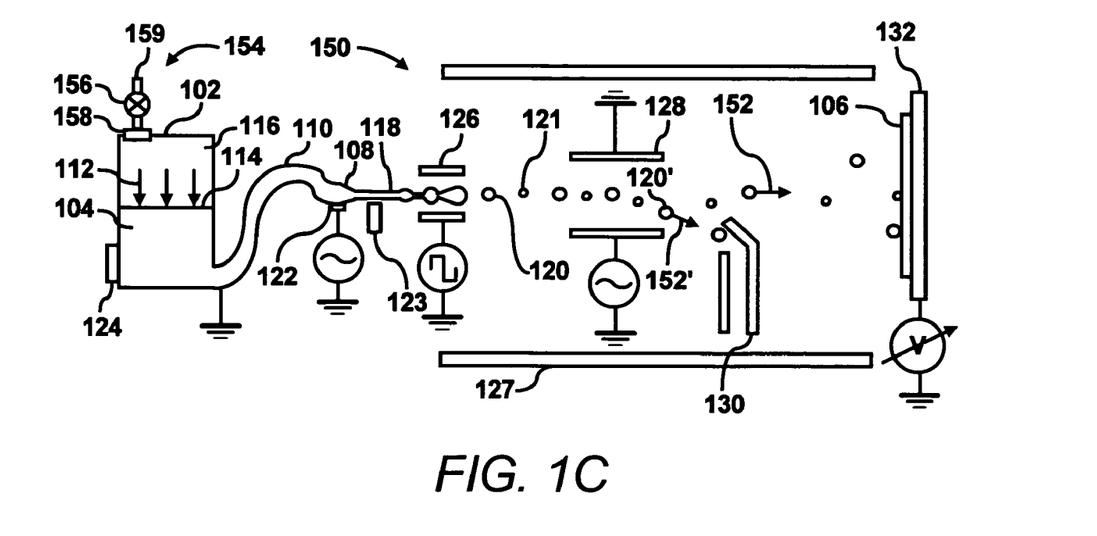

FIG. 1C shows a schematic illustration of a system 150 for delivering material onto a substrate, in which the droplets 120, 121 are steered through use of components designed to steer the droplets 120, 121. The system 150 includes all of the elements set forth herein above with respect to FIG. 1B. Therefore, the following discussion of FIG. 1C is set forth with the understanding that those components not specifically addressed are to be understood as having been described herein above with respect to FIG. 1B. However, as described herein below, some of the components may be operated in manners that differ from those described herein above with respect to FIG. 1B.

As also described herein above, the deflection plates 128 may operate to control the trajectories of the droplets 120 by varying the level of electrostatic charge applied to the upper or lower deflection plate. For instance, if the droplets 120 are negatively charged, the trajectory of a droplet 120 may be altered such that the droplet 120 is to land or impact at a higher location on the substrate 106. In this example, the upper deflection plate may be charged with a positive potential and the lower deflection may be charged with a negative potential such that the droplet 120 will be attracted toward the upper deflection plate and will be repelled from the lower deflection plate.

As shown in FIG. 1C, some of the droplets 120, 121, for instance, unwanted droplets 120', may be discarded by altering their trajectories toward the collection plate 130, as illustrated by the arrow 152'. In addition, the trajectories of the remaining droplets 120, 121 may be controlled such that they hit the substrate 106 at various 2-dimensional locations along a vertical plane of FIG. 1C with the application of another pair of deflection plates (not shown) that is orthogonal to the deflection plates 128 to achieve a two degree of freedom deposition of material 104 onto the substrate 106. The support plate 132 may also be moved along axes that extend into and parallel to FIG. 1C respectively. The additional two-dimensional movement of the support plate 132 will extend the two dimensional deflection range of the deflection plates 128 in a block-by-block manner to cover the entire substrate 106. The support plate 132 may further be relatively fixed and a plurality of reservoirs 102 may be positioned along an axis that is either in the plane of or perpendicular to the plan of FIG. 1C. In any regard, the droplets 120, 121 may be deposited on the substrate 106 with at least two degrees of freedom. The droplets 120, 121 may also be stacked upon each other to generally enable structures created by the droplets 120,121 to have heights higher than single droplets 120 or to otherwise form a layered structure.

FIG. 1C also illustrates a re-filling device 154 composed of a valve 156 and an opening 158 in the reservoir 102. The re-filling device 154 enables additional material 104 to be inserted into the reservoir 102. The re-filling device 154 may include an interface 159 to enable connection of the re-filling device 154 to, for instance, a supply tank of the additional material.

Although the re-filling device 154 has been illustrated as containing a valve 156 positioned through an opening 158 in the reservoir 102, it should be understood that other devices suitable for enabling insertion of material 104 into the reservoir 102 may be employed without departing from a scope of the system 150. These devices may include, for instance, a cap to cover the opening 158, a seal, a septum, and the like. In addition, a syringe-like apparatus may be employed to inject material 104 into the reservoir 102 without departing from a scope of the system 150.

The reservoir 102 may comprise a replaceable component in the system 150. That is, for instance, the reservoir 102 may be removably attached to the arcuate section 110 such that the reservoir 102 may be replaced when the material 104 contained therein is consumed or when a different reservoir 102 containing a different material is to be employed in the system 150. As another example, the reservoir 102, the arcuate section 110, the nozzle 108, and the PZT transducer 122, may comprise an integrally manufactured component that may be replaced in, for instance, the situations described above.

Figure 1D:
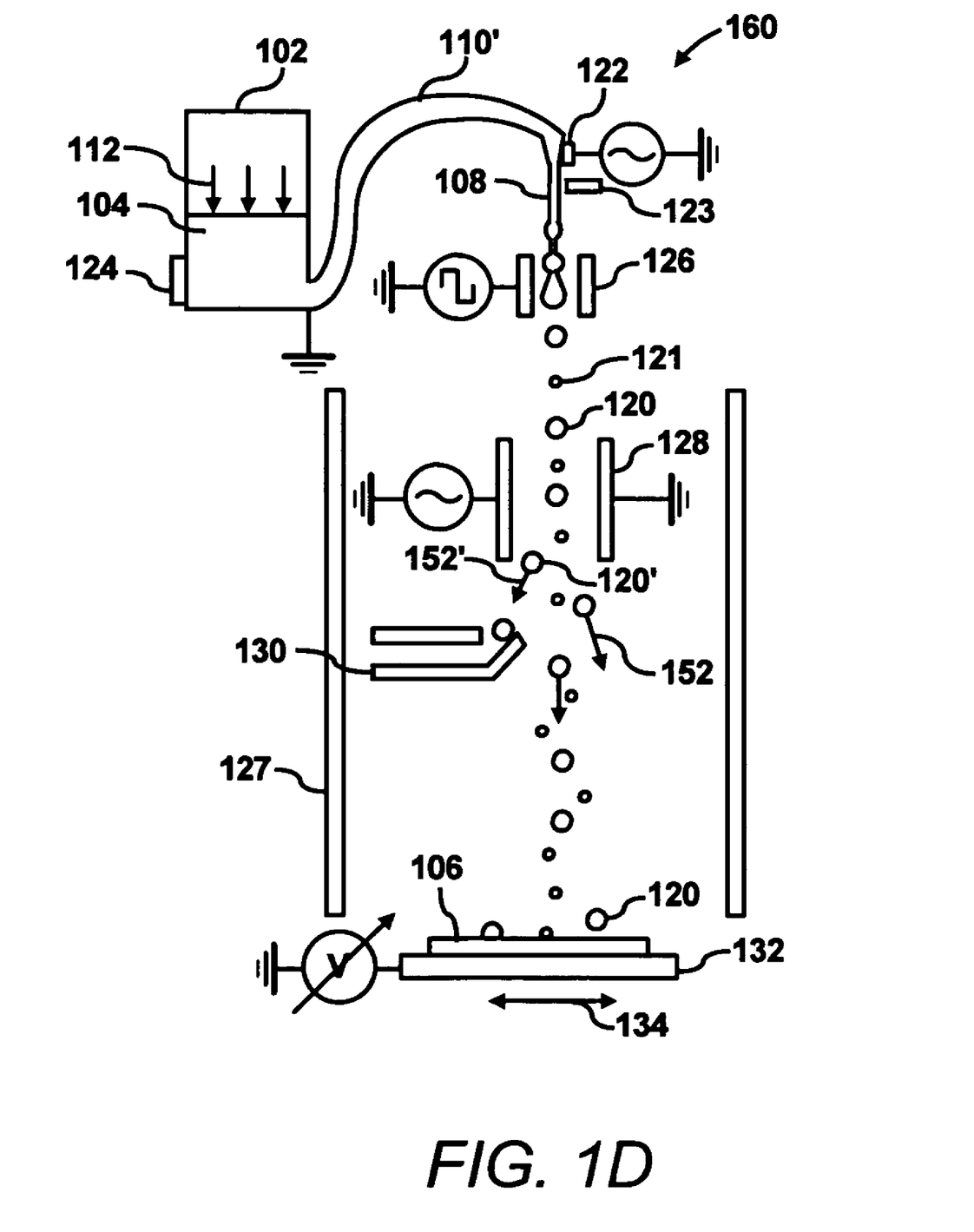

FIG. 1D shows a schematic illustration of a system 160 for delivering material onto a substrate 106, in which the flight path of the droplets 120 is generally vertical. The system 160 includes all of the elements set forth herein above with respect to FIG. 1C. Therefore, the following discussion of FIG. 1D is presented with the understanding that those components not specifically addressed are to be understood as having been described herein above with respect to either FIG. C. In comparing FIG. 1D from FIG. 1C, it is evident that the major distinction between the two systems is the direction in which the material 104 is ejected from the nozzle 108. More particularly, the nozzle 108 is illustrated as opening in a generally downward or vertical direction with respect to FIG. 1C.

In addition, the arcuate section 110' is depicted as having a relatively larger height than the arcuate section 110 shown in FIG. 1C. Based upon the configuration of the arcuate section 110', as the pressure applied to the material 104 is decreased beyond a predetermined level, the material 104 in the nozzle 108 is caused to either flow back into the reservoir 102 or remain in the arcuate section 110'. In this regard, the arcuate section 110' substantially prevents accumulation and dry-up of the material 104 in the nozzle 108. Therefore, the system 160 may remain inactive for relatively long periods of time without concern for nozzle 108 blockage.

Although not shown in FIG. 1D, the reservoir 102 may also include the re-filling device 154 shown in FIG. 1C. Additional material 104, having either the same or different composition, may therefore be inserted into the reservoir 102 as described herein above with respect to FIG. 1C.

Additionally, the reservoir 102 may comprise a replaceable component in the system 160. That is, for instance, the reservoir 102 may be removably attached to the arcuate section 110' such that the reservoir 102 may be replaced when the material 104 contained therein is consumed or when a different reservoir 102 containing a different material is to be employed in the system 160. As another example, the reservoir 102, the arcuate section 110', the nozzle 108, and the PZT transducer 122, may comprise an integrally manufactured component that may be replaced in, for instance, the situations described above.

FIGS. 1A–1D generally illustrate various jetting assemblies 100, 100', 150, and 160 in which materials 104 are deposited to the substrate 106. The materials 104 employed in the systems 100, 100', 150, and 160 may also include, for instance, etchants designed to remove materials in selected regions. For instance, the etchant may be applied onto an area containing unwanted materials 104. The etchant may contact the unwanted materials and volatize it, for instance, in conjunction with heat and/or light. Alternatively, a first material may be applied onto a second material, in which the first material oxidizes the second material, thereby making the second material non-conducting.

According to further embodiments, the jetting assemblies 100, 100', 150, and 160 may be employed in various other manners to assist in the fabrication of electronic circuits. For instance, the jetting assemblies 100, 100' 150, and 160 may be operated to apply masking layers or resists onto the substrate. The masking layers or resists may then be used, for instance, in conventional lithographic processes.

Figure 2:
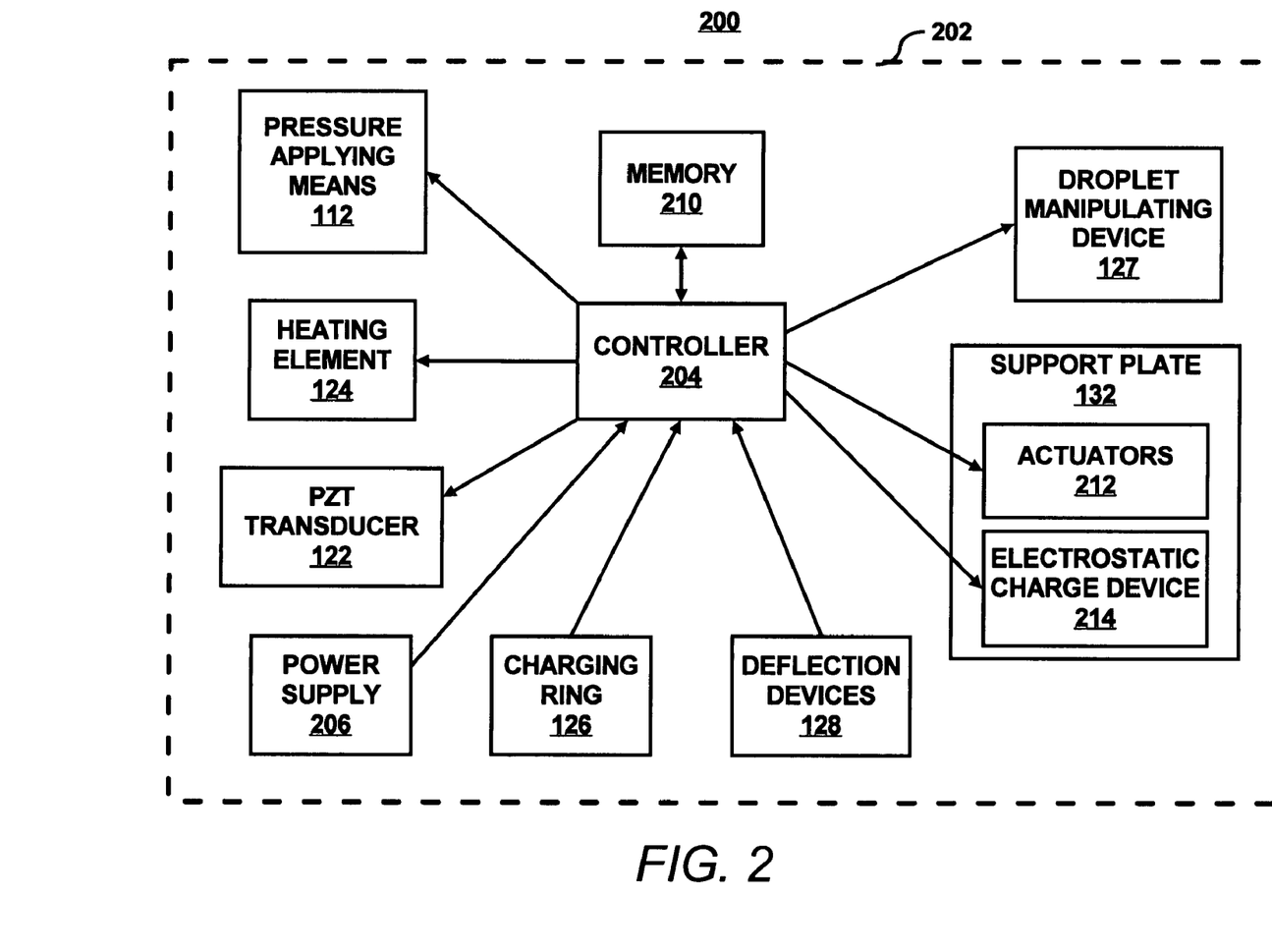
FIG. 2 is a block diagram of a control scheme for operating a jetting assembly for delivering material onto a substrate, according to an embodiment of the invention.

FIG. 2 is a block diagram 200 of a control scheme 202 for operating a system for delivering material onto a substrate. It should be understood that the following description of the block diagram 200 is but one manner of a variety of different manners in which such a control scheme 202 may be configured. For instance, the control scheme 202 may include any number of controllers and memories configured to operate the various components contained in the material delivering system. In addition, it should be understood that the block diagram 200 may include additional components and that some of the components described herein may be removed and/or modified without departing from a scope of the control scheme 202 described herein.

The control scheme 202 includes a controller 204 for controlling operations of the material delivering system, for instance, the jetting assemblies 100, 100', 150, and 160. In this regard, the following discussion of the control scheme 202 makes references to the elements contained in the jetting assemblies 100, 100', 150, and 160. It is to be understood, however, that the references to these jetting assemblies 100, 100', 150, and 160 are for purposes of clarity and understanding and are not meant to limit the control scheme 202. Thus, it should also be understood that control scheme 202 may, in certain instances, be implemented in systems having configurations that may differ from those described with respect to the jetting assemblies 100, 100', 150, and 160.

The controller 204 may control comprise a microprocessor, a micro-controller, an application specific integrated circuit (ASIC), and the like. The controller 204 may be interfaced with a power supply 206 and may operate to vary the voltage supplied to one or more components of the material delivering system. For instance, the controller 204 may control the amount of pressure a pressure applying means 112 applies onto a material, for instance, material 104, by varying the amount of voltage supplied to the pressure applying means.

The controller 204 may also be interfaced with a memory 210 configured to provide storage of a computer software that provides the functionality of the controller 204 in operating the material delivery system. The memory 210 may be implemented as a combination of volatile and non-volatile memory, such as DRAM, EEPROM, flash memory, and the like. The device memory 210 may also be configured to provide a storage for containing data/information pertaining to the manner in which the various material delivery system components may be operated to form various electronic circuits.

Based upon algorithms or software stored in the memory 210, the controller 204 may operate some or all of the components of the material delivery system. As stated above, the controller 204 may control the amount of pressure applied to the material by the pressure applying means 112. In this regard, the fluid column length and its exit velocity from a nozzle 108 may be substantially controlled. In addition, the controller 204 may operate a heating element 124 to control the temperature of the material contained in the reservoir 102. The controller 204 may operate the heating element 124 by varying the voltage supplied to the heating element 124. In addition, information pertaining to the desired temperatures of various materials to be used in the material delivery system may be stored in the memory 210. The controller 204 may access this information and may operate the heating element 124 to generate varying levels of heat depending upon the material contained in the reservoir 102.

The controller 204 may also be configured to control the operations of a PZT transducer 122. The PZT transducer may be electrically connected to the controller 204 and the controller 204 may vary the operations of the PZT transducer 122 by varying the voltage and frequency supplied to the PZT transducer 122. The controller 204 may also access information stored in the memory 210, for instance a look-up table (not shown), that correlates the voltage and frequency necessary to create a desired acoustical modulation. The information may also contain relevant data pertaining to various voltage and frequency levels needed for various materials.

The controller 204 may also be electrically connected to a charging ring 126 and deflecting plates 128. The charging ring 126 and the deflection plates 128 may be operated in manners as described herein above. In this regard, the controller 204 may operate the charging ring 126 to vary the charge applied to the droplets 120, 121. In addition, the controller 204 may operate the deflection plates 128 to vary the flight paths of one or more of the droplets 120, 121.

In one respect, the controller 204 may control the polarity and/or the level of electrostatic charge supplied to the charging ring 126 and the deflection plates 128. The controller 204 may thus control, for instance, the charges supplied to the droplets 120, 121, as they break off from the fluid column 118 inside the charging ring 126. In addition, and as described herein above, the controller 204 may control the trajectories of the charged droplets 120, 121 by varying the electrostatic potential supplied to the deflection plates 128.

The controller 204 may further be configured to control the droplet manipulating device 127. As described herein above, the droplet manipulating device 127 may be employed to manipulate various characteristics of the droplets 120, 121 and/or their flight paths. In this regard, the controller 204 may be operable to control the droplet manipulating device 127 in various manners such that the various characteristics of the droplets 120, 121 may be varied. By way of example, the controller 204 may operate to control the heat supplied through the droplet manipulating device 127, the airflow characteristics in the space of the droplet 120, 121 flight paths, one or more lasers of the droplet manipulating device 127, etc.

The controller 204 may thus control, for instance, the formation of droplets 120, 121, the amount of charges trapped in the droplets 120, 121, the direction of droplet 120, 121 flight, the heat supplied to the droplets 120, 121, the amount of gas or other reactive substances supplied to the droplets 120, 121, and various other characteristics of the droplets 120, 121, through control of the droplet manipulating device 127, the charging ring 126, the deflection plates 128, etc. The types of control available to the controller 204 will depend upon the configuration and composition of the droplet manipulating device 127 as well as the types of materials 104 being deposited.

In the control scheme 202, the controller 204 may control various operations of a support plate 132. For instance, as shown in FIG. 2, the support plate 132 may include one or more actuators 212 configured to manipulate the position of the support plate 132 with respect to, for instance, the deflection plates 128. As described herein above, the support plate 132 may be manipulated along the axes of one or more dimensions to enable positioning of the droplets 120, 121 on various locations of the substrate 106. The controller 204 may control the actuators 212 to manipulate the support plate 132 in very precise movements to thereby control the positioning of the droplets 120, 121 on the substrate 106.

The controller 204 may also control the voltage supplied to an electrostatic charge device 214 of the support plate 132. As also described herein above, an electrostatic charge may be supplied to the support plate 132 to control either acceleration or deceleration of the droplets 120, 121 as they approach the substrate 106. Thus, the controller 204 may control the polarity of the electrostatic charge as well as its relative strength to vary the acceleration or deceleration of the droplets 120, 121.

Although not shown, the controller 204 may also control a magnetic field producing device. The magnetic field producing device may be used to apply a magnetic field that generally causes the molecules in the droplets 120, 121 to align in a desired direction. The controller 204 may, for instance, control the relative strength of the magnetic field producing device to thereby control the strength of the magnetic field produced.

The controller 204 has been described as controlling operations of some of the material delivery system components through variance of voltage supplied to those components. However, the controller 204 may also operate some or all of the material delivery system components through transmission of control signals to those components. In this regard, some or all of the material delivery system components may include mechanisms designed to operate the components based upon instructions received from the controller 204. For instance, these mechanisms may include separate controllers configured to receive and process the instructions received from the controller 204.

Figure 3:
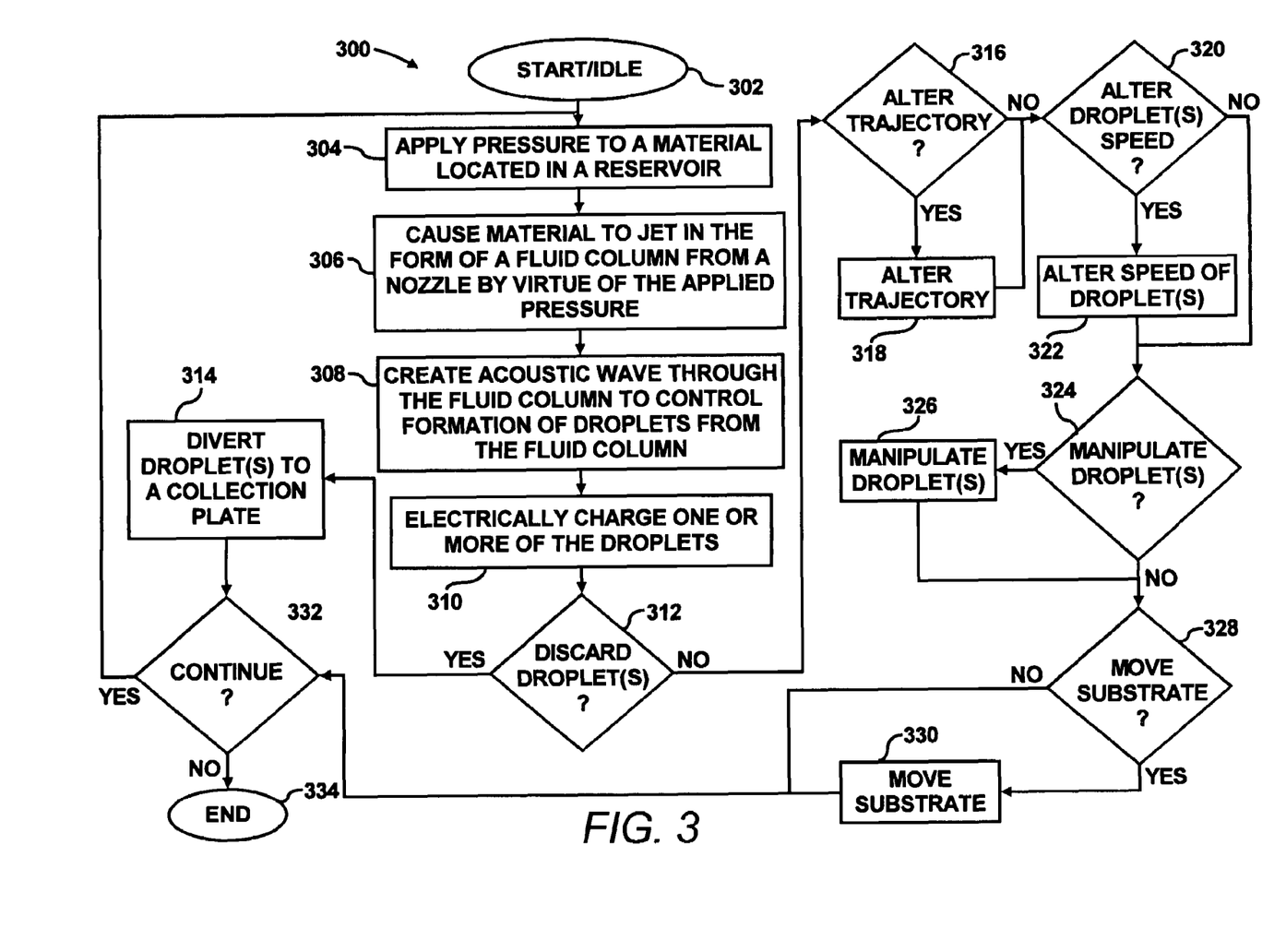
FIG. 3 illustrates a flow diagram of an operational mode of a method for operating a material delivery system, according to an embodiment of the invention.

FIG. 3 illustrates a flow diagram of an operational mode 300 of a method for operating a material jetting system. It is to be understood that the following description of the operational mode 300 is but one manner of a variety of different manners in which the material delivery system described herein may be practiced. It should also be apparent to those of ordinary skill in the art that the operational mode 300 represents a generalized illustration and that other steps may be added or existing steps may be removed, modified or rearranged without departing from a scope of the material delivery system disclosed herein.

The description of the operational mode 300 is made with reference to the block diagram 200 illustrated in FIG. 2 and the jetting assemblies 100, 100', 150, and 160 illustrated in FIGS. 1A–1D, respectively, and thus makes reference to the elements cited therein. It should, however, be understood that the operational mode 300 is not limited to the elements set forth in the block diagram 200 nor the jetting assemblies 100, 100', 150, and 160. Instead, it should be understood that the operational mode 300 may be practiced with systems having different configurations than that presented in the block diagram 200 and the jetting assemblies 100, 100', 150, and 160.

The operational mode 300 may be initiated in response to a variety of stimuli at step 302. For example, the operational mode 300 may be initiated in response to a manual instruction by an operator, a predetermined lapse of time, in response to receipt of a transmitted signal, etc. Once initiated, at step 304, pressure may be applied to the material 104 contained in the reservoir 102. The pressure may be applied by a pressure applying means 112 as described in greater detail herein above. In addition, the pressure applying means 112 may apply a substantially uniform amount of pressure onto the material 104. In general, the amount of pressure applied to the material 104 may be consonant with the fluid column length and exit velocity from a nozzle 108. In addition, through application of the pressure by the pressure applying means 112, the material 104 may be channeled through an arcuate section 110, 110' prior to reaching the nozzle 108. As also described herein above, the arcuate section 110, 110' may be useful in substantially preventing blockage of the nozzle 108.

The application of pressure on the material 104 also generally causes the material 104 to jet from the nozzle 108 as indicated at step 306. In addition, an acoustic wave is generated through the fluid column 118 formed by the material 104 jetted from the nozzle 108 at step 308. The acoustic wave may be generated by a PZT transducer 122 located proximate the nozzle 108. Droplets 120 break off from the fluid column 118 as dictated by the Rayleigh instability. In addition, satellite droplets 121 may also break off from the fluid column 118 during droplet 120 formation from the fluid column 118.

One or more of the droplets 120, 121 from the fluid column 118 are electrically charged by a charging ring 126 at step 310. The manner in which the droplet(s) 120, 121 receive electrical charge is described in detail herein above. After exiting the charging ring 126, the droplets 120, 121 travel past a pair of deflection plates 128. The deflection plates 128 generally operate to alter the trajectories of charged droplets 120, 121.

At step 312, the controller 204 may determine whether certain ones or all of the droplets 120, 121 are to be discarded. Certain ones of the droplets 120, 121 may be discarded, for instance, if it is determined that those droplets 120, 121 do not need to be applied to the substrate 106. By way of example, the droplets 120 may be discarded, leaving the satellite droplets 121 to be deposited onto the substrate 106. If the controller 204 determines that certain ones of the droplets 120, 121 are to be discarded, the controller 204 may control the deflection plates 128 by sending electrostatic charges, or the controller 204 may operate the charging ring 126 by altering the applied electrostatic potential but keeping the deflection plates 128 at a substantially fixed charging level to cause the determined ones of the droplets 120, 121 to be diverted to the collection plate 130 at step 314. In addition, if the controller 204 determines that none of the droplets 120, 121 are to be discarded or for those droplets 120, 121 that are intended to reach the substrate 106, the controller 204 may determine whether the trajectories of those droplets 120, 121 that received charges are to be altered at step 316. The controller 204 may determine that the trajectories of certain ones of the droplets 120, 121 are to be altered to vary their positions on the substrate 106.

If the controller 204 determines that one or more of the droplet 120, 121 trajectories are to be altered, the controller 204 may operate the deflection plates 128 by sending electrostatic charges, or the controller 204 may operate the charging ring 126 by altering the applied electrostatic potential but keeping the deflection plates 128 at a fixed charging level to alter the trajectories of the desired droplets 120, 121 at step 318. This may be accomplished, for instance, by varying the amount and polarity of the electrical charges applied to the deflection plates 128.

Following step 316 or 318, at step 320, the controller 204 may determine whether the velocity of one or more of the droplets 120, 121 should be altered. More particularly, the controller 204 may determine whether it will be beneficial to either accelerate or decelerate one or more of the droplets 120, 121 prior to their impacting the substrate 106. If the velocities of one or more of the droplets 120, 121 are to be altered, the controller 204 may control an electrostatic charge device 214 of the support plate 132 to vary the electrostatic charges around the substrate 106 at step 322. To accelerate a droplet 120, 121, the controller 204 may operate the electrostatic charge device 214 to supply electrostatic charges having an opposite polarity to that of the charge of the droplet 120, 121. Conversely, to decelerate a droplet 120, 121, the controller 204 may operate the electrostatic charge device 214 to supply electrostatic charges having the same polarity as that of the charge of the droplet 120, 121.

At step 324, the controller 204 may determine whether the droplets 120, 121 are to be manipulated. This determination may be made according to the programming of the controller 204 and may be based upon the material 104 being applied to the substrate 106 as well as the desired physical properties of the material 104 to be deposited onto the substrate 106. If the controller 204 determines that the droplets 120, 121 are to be manipulated, the controller 204 may operate the droplet manipulating device 127 to manipulate the droplets 120, 121 at step 326. Various manners in which the droplets 120, 121 may be manipulated are described in detail herein above with respect to FIG. 1A. In this regard, the droplet manipulating device 127 may be operated to manipulate the droplets 120, 121 during their flights to the substrate 106 or after the droplets 120, 121 have been deposited on the substrate 106. In addition, the droplet manipulating device 127 may be configured to manipulate the droplets 120, 121 at one or more times during or following the break-off of the droplets 120, 121 from the fluid column 118, for instance, prior to step 312.

At step 328, the controller 204 may determine whether the substrate 106 is to be moved. For instance, the controller 204 may determine that the substrate 106 should be moved in a system where the substrate 106 is required to be moved to facilitate positioning the droplets 120, 121 at various locations on the substrate 106. In this type of configuration, the controller 204 may determine that the substrate 106 is to be moved to allow for the droplets 120, 121 to be positioned at various locations on the substrate 106 to, for instance, create electronic circuit components. If the controller 204 determines that the substrate 106 is to be moved, the controller 204 may operate one or more actuators 212 of the support plate 132 to reposition the substrate 106 at step 330. Otherwise, the controller 204 may determine whether the operational mode 300 is to continue at step 332. The controller 204 may also make this determination following step 314.

If it is determined that the operational mode 300 is to continue, steps 304-332 may be repeated for any reasonably suitable period of time, for instance, indefinitely, until the fabrication of the electronic circuit is complete, etc. On the other hand, if it is determined that the operational mode 300 is to be discontinued, for instance, a time period expires, the electronic circuit is complete, etc., the operational mode 300 may end as indicated at step 334. As described herein above, the arcuate section 110, 110' of the reservoir 102 generally operates to prevent the material 104 from settling in the nozzle 108. Therefore, the operational mode 300 may be discontinued for relatively long periods of time without concern for nozzle 108 blockage.

The operations set forth in the operational mode 300 FIG. 3 may be contained as utilities, programs, or subprograms, in any desired computer accessible medium. In addition, the operational mode 300 may be embodied by computer programs, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM/DVD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 4:
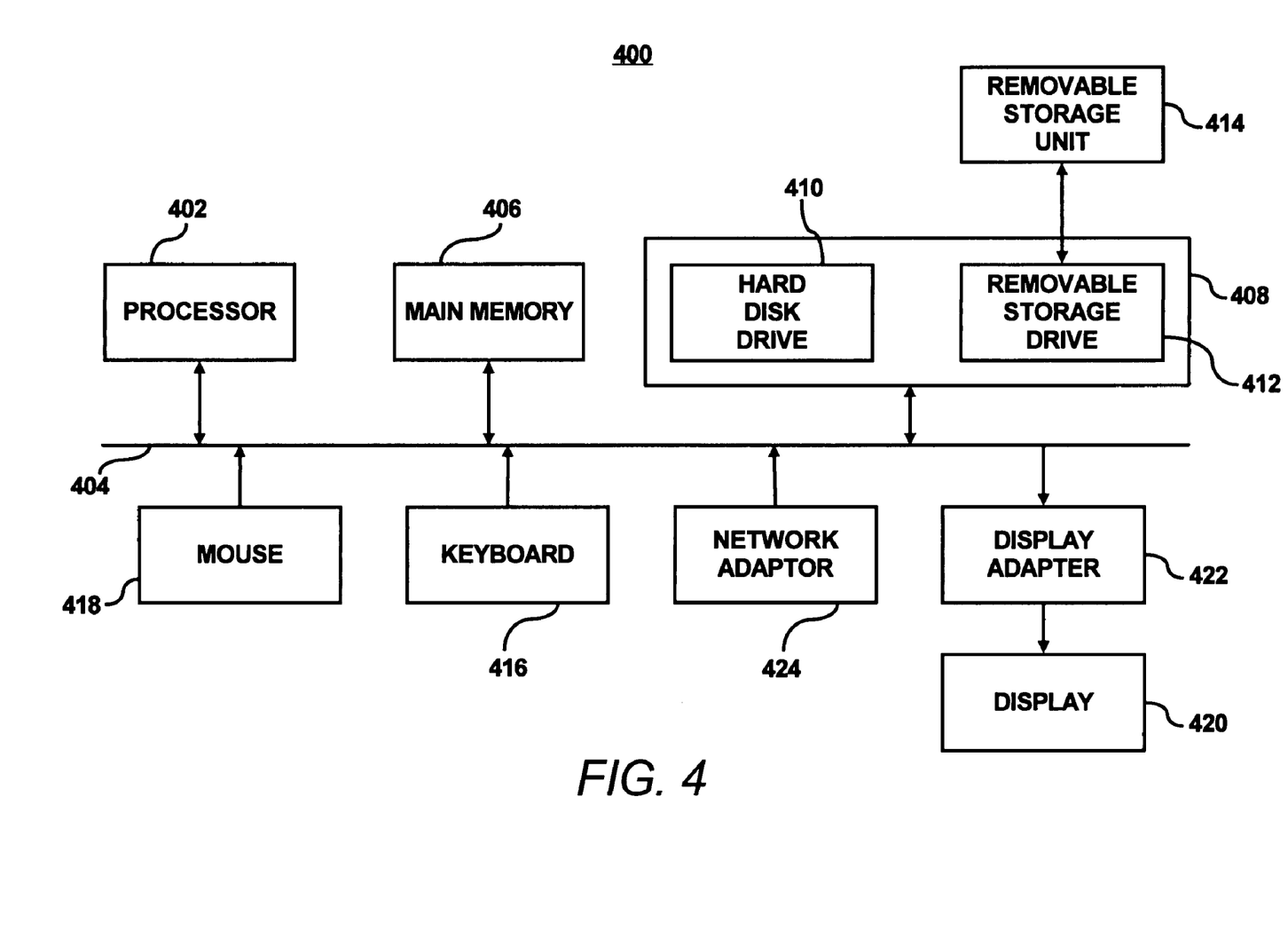
FIG. 4 illustrates a computer system that may include a controller operable to control the system for delivering material, according to an embodiment of the invention.

FIG. 4 illustrates a computer system 400 that may include the controller 204. In this respect, the computer system 400 may be used as a platform for executing one or more of the functions described herein above with respect to the controller 204. As shown, the computer system 400 includes one or more controllers, such as a processor 402. The processor 402 may be used to execute some or all of the steps described in the operational mode 300. Commands and data from the processor 402 are communicated over a communication bus 404. The computer system 400 also includes a main memory 406, for instance, memory 210, such as a random access memory (RAM), where the program code for the control scheme 202 may be executed during runtime, and a secondary memory 408. The secondary memory 408 includes, for example, one or more hard disk drives 410 and/or a removable storage drive 412, representing a floppy diskette drive, a magnetic tape drive, a compact disk drive, Flash based card/stick memory, etc., where a copy of the program code for the control scheme 202 may be uploaded and/or stored.

The removable storage drive 410 reads from and/or writes to a removable storage unit 414 in a well-known manner. User input and output devices may include a keyboard 416, a mouse 418, a touch screen or a stylus (not shown), and a display 420. A display adaptor 422 may interface with the communication bus 404 and the display 420 and may receive display data from the processor 402 and convert the display data into display commands for the display 420. In addition, the processor 402 may communicate over a network, for instance, the Internet, LAN, etc., through a network adaptor 424.

It will be apparent to one of ordinary skill in the art that other known electronic components may be added or substituted in the computer system 400. In addition, the computer system 400 may include a system board or blade used in a rack in a data center, a conventional "white box" server or computing device, etc. Also, one or more of the components in FIG. 4 may be optional (for instance, user input devices, secondary memory, etc.).

Through implementation of the system and method described herein above, electronic circuits may be manufactured in a relatively simple and efficient manner. In addition, the systems and methods described herein above generally enable the fabrication of electronic circuits through use of a widely diverse range of materials covering, for instance, inorganic and organic conductive materials, inorganic and organic semiconductor materials, inorganic and organic dielectric materials, inorganic and organic ferroelectric materials, inorganic and organic optical and photonic materials, resist materials, dopant materials, additives, catalysts, reactive materials, metals, passivation materials, etchants, protective coatings, etc. The materials may also include molten or liquid materials, material particles suspended in a liquid medium, colloidal suspensions of the material particles in a medium, liquid chemical compounds containing the material, chemical solutions of the material with a liquid solvent, chemical materials capable of enhancing or modifying one or more properties of other deposited materials, chemical materials capable of enhancing or modifying one or more properties of the substrate on which the materials are deposited, etc. In addition, the amount of time required to apply materials onto substrates may be relatively reduced as compared with known systems through implementation of the continuous material flow schemes presented herein.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. An assembly for depositing material onto a substrate, said assembly comprising:
   a reservoir containing the material, said reservoir having a nozzle through which the material is jetted and formed into droplets, wherein the droplets travel through flight paths prior to deposition onto the substrate;
   a charging ring for inducing an electrical charge to one or more of the droplets;
   a plurality of deflection plates for controlling the flight paths of the droplets; and
   a droplet manipulating device configured to manipulate the droplets at least one of during the flight paths and after deposition of the droplets onto the substrate.

2. The assembly according to claim 1, further comprising
   a heating device configured to adjust at least one fluidic property of the material;
   an arcuate section configured to retract the material from the nozzle;
   a capping device configured to substantially prevent at least one of material loss, drying of the material, and contamination of the material; and
   an acoustic modulating device configured to control at least one of droplet formation frequency and droplet size.

3. The assembly according to claim 1, further comprising:
   a collection plate configured to receive one or more of the droplets, wherein the one or more droplets are not directed to become deposited on the substrate.

4. The assembly according to claim 1, wherein to droplet manipulating device comprises an environment through which the droplets are configured to travel, wherein the environment is configured to be varied.

5. The assembly according to claim 4, wherein the droplet manipulating device is configured to receive one or more additional materials configured to react wit to droplets.

6. The assembly according to claim 4, wherein a temperature of the environment is configured to be varied to thereby vary the temperature of the environment through which the droplets travel.

7. The assembly according to claim 4, wherein the droplet manipulating device is configured to affect formation of the droplets through at least one of aerodynamic control and dielectric properties of the material.

8. The assembly according to claim 4, wherein the droplet manipulating device is configured to affect at least one of a direction and a stability of the droplets through at least one of aerodynamic control and dielectric properties of the material.

9. The assembly according to claim 1, wherein the droplet manipulating device comprises a laser configured to act upon the droplets.

10. The assembly according to claim 9, wherein the laser is configured to at least one of alter the sizes of the droplets and to initiate a chemical reaction in the droplets.

11. The assembly according to claim 9, wherein the laser is configured to at least one of anneal the droplets, sinter the droplets, and cause a chemical reaction after the droplets have been deposited on the substrate.

12. The assembly according to claim 1, wherein the droplet manipulating device comprises magnets configured to emit a magnetic field through which the droplets travel, said magnets being configured to substantially align molecules contained in the droplets.

13. The assembly according to claim 1, further comprising
    a support plate configured to support the substrate.

14. The assembly according to claim 13, wherein the support plate is configured to emit an electrical field to either increase or decrease the velocities of the droplets prior to deposition onto the substrate.

15. The assembly according to claim 13, wherein the support plate is configured to emit at least one of a magnetic field and an electrical field to substantially align molecules contained in the droplets.

16. The assembly according to claim 13, wherein the support plate is configured to be at least one of heated and cooled to thereby vary the temperature of the substrate.

17. The assembly according to claim 1, wherein the substrate is configured to chemically react with the material to thereby achieve a desired property of one or both of the material and the substrate.

18. The assembly according to claim 1, wherein the substrate is configured to act as at least one of a template for crystal growth of the material and a catalyst for a chemical reaction in the material.

19. The assembly according to claim 1, wherein the material comprises one or more of conductive, semiconductive, dielectric, ferroelectric, magnetic, optical and photonic materials.

20. The assembly according to claim 1, wherein the material comprises one or more of resist, dopant; additive, catalyst, and reactive materials.

21. The assembly according to claim 1, wherein the material further comprises one or more of a molten material, a liquid material, a suspension of material particles within a liquid medium, a colloidal suspension of material particles within a medium, a liquid chemical compound, a chemical solution of the at least one material with a liquid solvent, and chemical materials configured to modify one or more properties of other materials.

22. The assembly according to claim 1, further comprising:
    an arcuate section positioned between the reservoir and the nozzle, wherein the material is configured to travel from the reservoir, through the arcuate section, and through the nozzle prior to being formed into droplets.

23. The assembly according to claim 1, wherein the material is configured to perform at least one of protection from the environment, the addition of interconnects, control of the shape and size of the deposited at least one material, and confinement of the shape and size of the deposited material.

24. A method for depositing material onto a substrate, the method comprising:
    forming droplets from a fluid column extending from a nozzle, wherein the droplets are configured to travel along flight paths;
    inducing an electrical charge into the droplets;
    controlling the flight paths of the droplets through application of another electrical charge; and
    manipulating the droplets at least one during a flight path from the nozzle to the substrate and after deposition onto the substrate.

25. The method according to claim 24, wherein the step of manipulating the droplets comprises varying the temperature of an environment through which the droplets travel.

26. The method according to claim 24, wherein the step of manipulating the droplets comprises adding one or more additional materials configured to react with the droplets into an environment through which the droplets travel.

27. The method according to claim 24, wherein the step of manipulating the droplets comprises affecting a drop formation of the droplets through at least one of aerodynamic control and the dielectric properties of the material.

28. The method according to claim 24, wherein the step of manipulating the droplets comprises affecting at least one of a direction and a stability of the droplets through at least one of aerodynamic control and the dielectric properties of the material.

29. The method according to claim 24, wherein the step of manipulating the droplets comprises using a laser to at least one of alter the sizes of the droplets and initiate a chemical reaction in the droplets.

30. The method according to claim 24, wherein the step of manipulating the droplets comprises using a laser to at least one of anneal the droplets and sinter the droplets after the droplets have been deposited on the substrate.

31. The method according to claim 24, wherein the step of manipulating the droplets comprises substantially aligning the molecules contained in the droplets through application of a magnetic field.

32. The method according to claim 24, wherein the step of manipulating the droplets comprises irradiating the material with at least one of energy and particles.

33. The method according to claim 24, wherein the step of manipulating the droplets comprises varying an electric field around the substrate to vary the velocities of the droplets impacting the substrate.

34. The method according to claim 24, wherein the step of forming droplets further comprises forming satellite droplets, said method further comprising:
discarding the droplets and depositing the satellite droplets on the substrate.

35. The method according to claim 24, wherein the step of manipulating the droplets comprises using the material deposited on the substrate as at least one of a lithography mask, a source of dopant, an etchant, and an underlayer of a final layer of at least one material.

36. The method according to claim 24, further comprising:
depositing the material on an at least one of an existing circuit, a flexible interconnect cable, and a micro-electro-mechanical system device.

37. A circuit comprising:
a substrate; and
at least one element deposited on the substrate through continuous jet printing, wherein the at least element is deposited in the form of droplets that have received electrical charges from a charging ring, wherein said droplets have also been manipulated by a droplet manipulating device, wherein the at least one element comprises one or more of conductive, semiconductive, dielectric, ferroelectric, magnetic, optical and photonic materials and wherein the substrate is configured to participate in at least one of heating or cooling conduction to the at least one element and chemically react with the at least one element.

38. The circuit according to claim 37, wherein the at least one element further is one or more of a molten material, a liquid material, a suspension of material particles within a liquid medium, a colloidal suspension of material particles within a medium, a liquid chemical compound, a chemical solution of the at least one material with a liquid solvent, and chemical materials configured to modify one or more properties of other materials.

39. A system for fabricating a circuit, said system comprising:
means for depositing a material to be deposited on a means for receiving the material;
means for inducing on electrical charge to the material jetted from the means for jetting;
means for controlling flight paths of the jetted material; and
means for manipulating the jetted material at least one of during the flight paths and after the jetted material has been deposited onto the means for receiving, to thereby fabricate the circuit.

40. A computer readable storage medium on which is embedded one or more computer programs, said one or more computer programs implementing a method for depositing material onto a substrate, said one or more computer programs comprising a set of instructions for
forming droplets from a fluid column extending from a nozzle, wherein the droplets are configured to travel along flight paths;
inducing an electrical charge into the droplets;
controlling the flight paths of the droplets through application of another electrical charge; and
manipulating the droplets at least one during a flight path from the nozzle to the substrate and after deposition onto the substrate, and
wherein the material comprises one or more of conductive, semiconductive, dielectrivc, ferroelectrie, magnetic; optical, photonic, resist, dopant, additive, catalyst, and reactive materials.

* * * * *